US012670947B2

(12) United States Patent
Hong et al.

(10) Patent No.: US 12,670,947 B2
(45) Date of Patent: Jun. 30, 2026

(54) MEMORY DEVICES AND METHODS FOR DECODING ADDRESSES THEREOF INVOLVING POWER GATING OF DECODING BLOCKS

(71) Applicant: Samsung Electronics Co., Ltd., Suwon-si (KR)

(72) Inventors: Seungki Hong, Suwon-si (KR); Sanghak Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 115 days.

(21) Appl. No.: 18/539,472

(22) Filed: Dec. 14, 2023

(65) Prior Publication Data

US 2024/0404579 A1      Dec. 5, 2024

(30) Foreign Application Priority Data

Jun. 2, 2023      (KR) ........................ 10-2023-0071912

(51) Int. Cl.
*G11C 8/10* (2006.01)
*G11C 11/4074* (2006.01)
*G11C 11/408* (2006.01)

(52) U.S. Cl.
CPC ...... *G11C 11/4087* (2013.01); *G11C 11/4074* (2013.01); *G11C 11/4085* (2013.01)

(58) Field of Classification Search
CPC ............ G11C 11/4087; G11C 11/4074; G11C 11/4085; G11C 11/418; G11C 8/08; G11C 8/10; G11C 11/4082; G11C 8/06; Y02D 10/00
See application file for complete search history.

(56) References Cited

U.S. PATENT DOCUMENTS

| | | | | |
|---|---|---|---|---|
| 5,844,840 | A | * | 12/1998 | Le .............................. G11C 8/08 |
| | | | | 365/185.23 |
| 6,426,655 | B2 | | 7/2002 | Desoto et al. |
| 6,674,672 | B2 | | 1/2004 | Forbes et al. |
| 7,035,162 | B2 | | 4/2006 | Chung et al. |
| 7,826,302 | B2 | | 11/2010 | Zhang |
| 7,870,362 | B2 | | 1/2011 | Hong et al. |
| 9,025,381 | B2 | * | 5/2015 | Hendrickson ............ G11C 8/12 |
| | | | | 365/185.12 |
| 10,115,441 | B1 | | 10/2018 | Yang et al. |
| 11,322,193 | B2 | | 5/2022 | Kim et al. |

(Continued)

*Primary Examiner* — Mushfique Siddique
(74) *Attorney, Agent, or Firm* — Wolf, Greenfield & Sacks, P.C.

(57) ABSTRACT

A memory device, which may include: a memory cell array including a plurality of memory cell groups; an intermediate block configured to decode a row address, and configured to output an active block flag and a decoded row address; and a row decoder configured to select a wordline of a plurality of wordlines connected to the memory cell array based on the active block flag and the decoded row address. The row decoder may be configured to convert a portion of the row decoder from an inactive state to an active state to activate a selected memory cell group from among the plurality of memory cell groups based on a received active request, the selected memory group corresponding to the active block flag, and the row decoder may be configured to select the wordline connected to the selected memory cell group based on the decoded row address.

20 Claims, 9 Drawing Sheets

(56)            References Cited

U.S. PATENT DOCUMENTS

| | | | |
|---|---|---|---|
| 2014/0104948 A1* | 4/2014 | Rhie | G11C 11/4085 365/185.11 |
| 2014/0126302 A1* | 5/2014 | Yoon | G11C 29/44 365/201 |
| 2015/0309743 A1* | 10/2015 | Sohn | G11C 5/025 711/105 |
| 2017/0140810 A1* | 5/2017 | Choi | G11C 11/40618 |
| 2017/0213586 A1* | 7/2017 | Kang | G06F 3/0673 |
| 2018/0190341 A1* | 7/2018 | Do | G11C 11/40615 |
| 2019/0304530 A1* | 10/2019 | Choi | G06F 1/32 |
| 2021/0134345 A1* | 5/2021 | Kwon | G11C 11/4087 |
| 2024/0005983 A1* | 1/2024 | Mathur | G11C 5/148 |
| 2024/0096396 A1* | 3/2024 | Hong | G11C 11/4074 |

* cited by examiner

| Decoding Address Line | Value |
|---|---|
| ABF_L1 | H or L |
| ABF_L2 | H or L |
| ⋮ | |
| ABF_Li | H or L |
| DRA_L1 | H or L |
| DRA_L2 | H or L |
| ⋮ | |
| DRA_Lk | H or L |

— — Determining
power gating
of decoder block

FIG.6

| Decoding Block | Power Gating | | |
| --- | --- | --- | --- |
| | Standby | Receiving ACT | Active |
| D_BLK1 | Enable | Disable | Disable |
| D_BLK2 | Enable | Enable | Enable |
| D_BLK3 | Enable | Enable | Enable |
| ⋮ | Enable | Enable | Enable |
| D_BLKn | Enable | Enable | Enable |

Selected Memory Cell Group
(For example, Memory Cell Group_1)

MEMORY DEVICES AND METHODS FOR DECODING ADDRESSES THEREOF INVOLVING POWER GATING OF DECODING BLOCKS

CROSS-REFERENCE TO RELATED APPLICATION

This application claims priority under 35 U.S.C. § 119 to Korean Patent Application No. 10-2023-0071912 filed on Jun. 2, 2023, in the Korean Intellectual Property Office, and the entire contents of the above-identified application are incorporated by reference herein.

BACKGROUND

1. Field

The present disclosure relates generally to memory devices, and more particularly, to memory devices and to methods for decoding addresses thereof.

2. Description of Related Art

Semiconductor memory devices may be classified as volatile memory devices or non-volatile memory devices. Volatile memory devices may exhibit faster read and/or write speeds when compared to the non-volatile memory devices. However, data stored in the volatile memory devices may disappear when a power applied to the volatile memory devices is turned off or disconnected. In contrast, the non-volatile memory devices may retain data stored in the non-volatile memory devices even when a power is turned off or disconnected. Therefore, non-volatile memory devices are typically used to store contents which must be preserved regardless of whether the power is supplied or not.

Volatile memory devices may decode an address received from a memory controller and may select a memory bank and a memory cell in a memory cell array through a row decoder and a column decoder. However, during decoding of an address, power may be consumed throughout the row decoder regardless of a selected memory cell.

SUMMARY

Aspects of the present disclosure provide memory devices in which power consumption may be reduced by gating power of decoding blocks unrelated to the active request among all decoding blocks of a row decoder when receiving an active request.

According to some embodiments, a memory device may include a memory cell array including a plurality of memory cell groups; an intermediate block configured to decode a row address, and configured to output an active block flag and a decoded row address; and a row decoder configured to select a wordline of a plurality of wordlines connected to the memory cell array based on the active block flag and the decoded row address. The row decoder may be configured to convert a portion of the row decoder from an inactive state to an active state to activate a selected memory cell group from among the plurality of memory cell groups based on a received active request, the selected memory group corresponding to the active block flag, and the row decoder may be configured to select the wordline of the plurality of wordlines connected to the selected memory cell group based on the decoded row address.

According to some embodiments, a method of decoding an address of a memory device includes gating power of a plurality of decoding blocks included in a row decoder of the memory device; decoding a row address to generate a decoded row address during receiving an active request; generating an active block flag based on the decoded row address; releasing gating power of a first decoding block of the plurality of decoding blocks based on the active block flag, the first decoding block corresponding to a selected memory cell group; and selecting a wordline of a plurality of wordlines connected to the selected memory cell group based on the decoded row address.

According to some embodiments, a memory device may include a memory cell array including a plurality of memory cell groups; an intermediate block configured to decode a row address and output an active block flag and a decoded row address; and a row decoder including a plurality of decoding blocks each connected to a respective memory cell group from the plurality of memory cell groups. The row decoder releases gating power of a selected decoding block of the plurality of decoding blocks based on the active block flag and reception of an active request; maintains gating power of the decoding blocks of the plurality of decoding blocks other than the selected decoding block; and selects a wordline corresponding to the decoded row address among wordlines connected to the selected decoding block.

Additional aspects will be set forth in part in the description which follows and, in part, will be apparent from the description, or may be learned by practice of the presented embodiments.

BRIEF DESCRIPTION OF THE FIGURES

The above and other objects and features of the present disclosure will become apparent by describing in detail some examples of embodiments thereof with reference to the accompanying drawings.

FIG. 2 is a block diagram illustrating a memory device of FIG. 1.

FIG. 5 is a table illustrating logical values of decoding address lines of FIG. 4.

FIG. 6 is a table illustrating states of power gating circuits connected to decoding blocks of FIG. 3 according to a state of a memory device.

DETAILED DESCRIPTION

Below, some examples of embodiments of the present disclosure will be described in detail and with sufficient clarity to permit those of ordinary skill in the art to implement the inventive concepts with relative ease.

Below, a DRAM will be used as an example for illustrating some features and functions of the present disclosure. However, other features and performances may be easily understood from information disclosed herein by a person of ordinary skill in the art. The inventive concepts of the present disclosure may be implemented in other embodiments or applied thereto. Further, the detailed description may be modified or changed according to viewpoints and applications without escaping from the scope, spirit, and other objects of the present disclosure.

Figure 1:
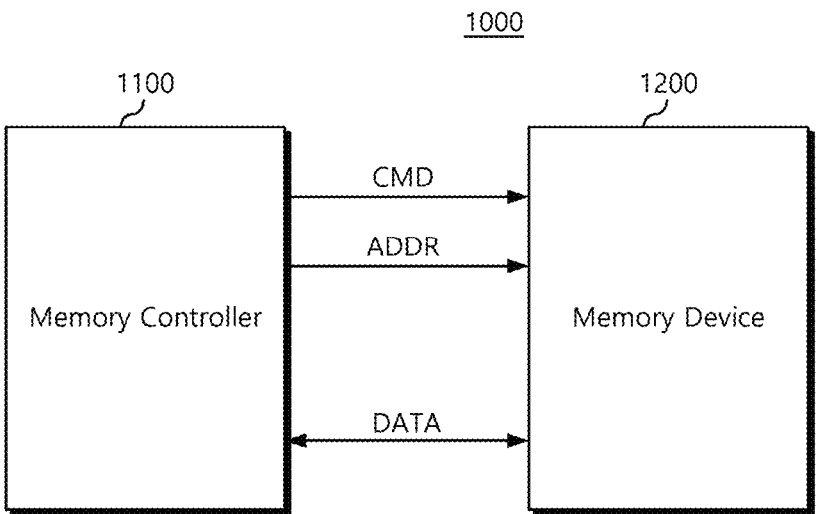
FIG. 1 is a block diagram illustrating a memory system according to some embodiments.

FIG. 1 is a block diagram illustrating a memory system according to some embodiments. Referring to FIG. 1, a memory system 1000 may include a memory controller 1100 and a memory device 1200.

According to some embodiments, the memory controller 1100 may perform an access operation of writing data to the memory device 1200 or reading data stored in the memory device 1200. For example, the memory controller 1100 may generate a command CMD and an address ADDR for writing data to the memory device 1200 or reading data stored in the memory device 1200. The memory controller 1100 may include at least one of a memory controller configured to control the memory device 1200, a system-on-chip (SoC) such as an application processor (AP), a central processing unit (CPU), a digital signal processor (DSP), and/or a graphics processing unit (GPU), as examples.

According to some embodiments, the memory controller 1100 may provide various signals to the memory device 1200 to control an overall operation of the memory device 1200. For example, the memory controller 1100 may be configured to control memory access operations of the memory device 1200 such as read operations and/or write operations. The memory controller 1100 may provide the command CMD and the address ADDR to the memory device 1200 to write data DATA in the memory device 1200 or to read data DATA from the memory device 1200.

According to some embodiments, the memory controller 1100 may generate various types of commands CMD to control the memory device 1200. For example, the memory controller 1100 may generate a bank request that corresponds to a bank operation of changing a state of a memory bank, among memory banks, to read or write data DATA. As an example, the bank request may include an active request for changing a state of a memory bank, among the memory banks, to an active state. The memory device 1200 may activate a row included in the memory bank, for example, a wordline, in response to the active request. The bank request may include a precharge request for changing the memory banks from an active state to a standby state after reading or writing of data DATA is completed. In addition, the memory controller 1100 may generate an input/output (I/O) request (for example, a column address strobe (CAS) request) for the memory device 1200, which may cause the memory device 1200 to perform a read operation or a write operation of data DATA. As an example, the I/O request may include a read request for reading data DATA from activated memory banks. As another example, the I/O request may include a write request for writing data DATA in the activated memory banks. The memory controller 1100 may generate a refresh command to control a refresh operation on the memory banks. However, the types of commands CMD described herein are merely examples, and other types of commands CMD may be present.

According to some embodiments, the memory device 1200 may output to the memory controller data DATA that is requested to be read by the memory controller 1100. The memory device 1200 may store, in a memory cell of the memory dece 1200 data DATA that is requested to be written by the memory controller 1100. The memory device 1200 may input and output data DATA based on the command CMD and the address ADDR. The memory device 1200 may include memory banks.

The memory device 1200 may be a volatile memory device, such as a dynamic random access memory (DRAM), a synchronous dynamic random access memory (SDRAM), a double data rate (DDR) DRAM, a DDR SDRAM, a low-power double data rate (LPDDR) SDRAM, a graphics double data rate (GDDR) SDRAM, a Rambus dynamic random access memory (RDRAM), a static random access memory (SRAM), or the like. Alternatively, the memory device 1200 may be implemented as a nonvolatile memory device, such as a resistive RAM (RRAM), a phase change memory (PRAM), a magnetoresistive memory (MRAM), a ferroelectric memory (FRAM), a spin-transfer torque RAM (STT-RAM), or the like. In the present specification, the advantages of the present disclosure have been described with respect to a DRAM, but the present disclosure is not limited thereto.

According to some embodiments, each of the memory banks may include a memory cell array divided in units of banks, and may include one or more components such as a row decoder, a column decoder, a sense amplifier, a write driver, or the like. The memory banks may store data DATA requested to be written in the memory device 1200, through the write driver, and may read data DATA requested to be read using the sense amplifier. The memory banks may further include a component for a refresh operation of storing and maintaining data in the cell array, or select circuits based on an address.

Figure 2:
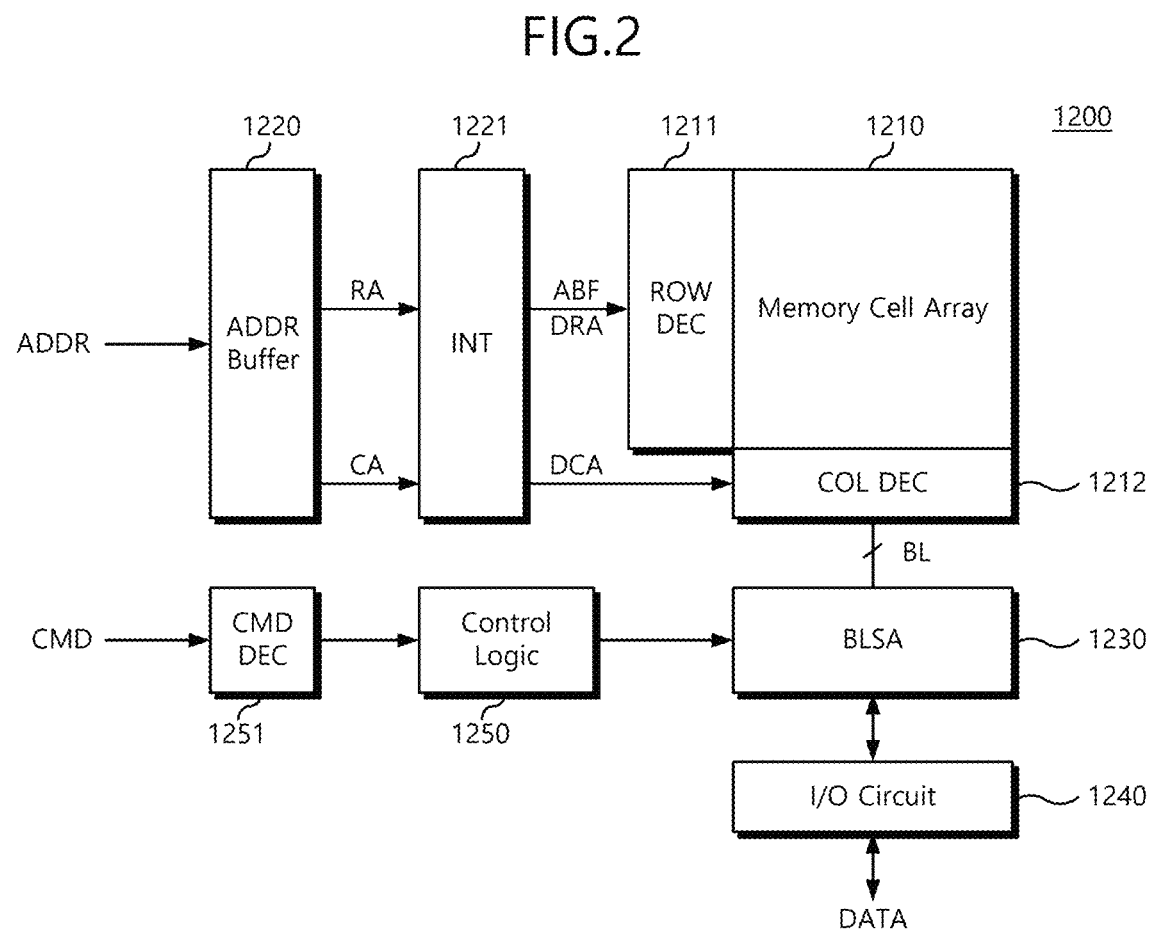

FIG. 2 is a block diagram illustrating a memory device of FIG. 1. Referring to FIG. 2, the memory device 1200 may include a memory cell array 1210, a row decoder 1211, a column decoder 1212, an address buffer 1220, an intermediate block 1221, a bitline sense amplifier 1230, an input/output circuit 1240, a command decoder 1251, and control logic 1250.

According to some embodiments, the memory cell array 1210 may include a plurality of memory cells arranged in a matrix of rows and columns. The memory cell array 1210 may include a plurality of wordlines and a plurality of bitlines BL connected to memory cells. The plurality of wordlines may be connected to rows of the memory cells, and the plurality of bitlines BL may be connected to columns of the memory cells.

According to some embodiments, the address buffer 1220 may receive an address ADDR from a memory controller, e.g., the memory controller 1100 of FIG. 1. For example, the address ADDR may include a row address RA that addresses or indicates a row of the memory cell array 1210 and a column address CA that addresses or indicates a column of the memory cell array 1210. The address buffer 1220 may transmit the row address RA and the column address CA to the intermediate block 1221.

According to some embodiments, the intermediate block 1221 may decode a row address RA and a column address CA received from the address buffer 1220. For example, the intermediate block 1221 may transmit a decoded row address DRA to the row decoder 1211. The intermediate block 1221 may transmit a decoded column address DCA to the column decoder 1212. In addition, the intermediate block 1221 may generate an active block flag ABF based on the decoded row address DRA. The intermediate block 1221 may transmit the active block flag ABF along with the decoded row address DRA to the row decoder 1211.

According to some embodiments, the row decoder 1211 may select one of the plurality of wordlines connected to the memory cell array 1210. For example, the row decoder 1211 may select a memory cell group including a wordline to be activated based on the active block flag ABF received from the intermediate block 1221. The row decoder 1211 may select a single wordline from the selected memory cell group based on the decoded row address DRA received from the intermediate block 1221 and activate the selected wordline.

According to some embodiments, the column decoder 1212 may select a predetermined bitline from among the plurality of bitlines BL of the memory cell array 1210. For example, the column decoder 1212 may select the predetermined bitline based on the decoded column address DCA received from the intermediate block 1221.

According to some embodiments, the bitline sense amplifier 1230 may be connected to the bitlines BL of the memory cell array 1210. For example, the bitline sense amplifier 1230 may sense a change in voltage of a selected bitline, among the plurality of bitlines BL, and may amplify and output the change in voltage. The input/output circuit 1240 may output data DATA to the memory controller 1100 through data lines based on a sensed and amplified voltage from the bitline sense amplifier 1230.

According to some embodiments, the command decoder 1251 may decode one or more of a write enable signal/WE, a row address strobe signal/RAS, a column address strobe signal/CAS, and a chip select signal/CS received from the memory controller 1100 such that control signals corresponding to the command CMD are generated in the control logic 1250. The command CMD may include an active request, a read request, a write request, or a precharge request. The control logic 1250 may control an overall operation of the bitline sense amplifier 1230 through control signals corresponding to the command CMD.

Figure 3:
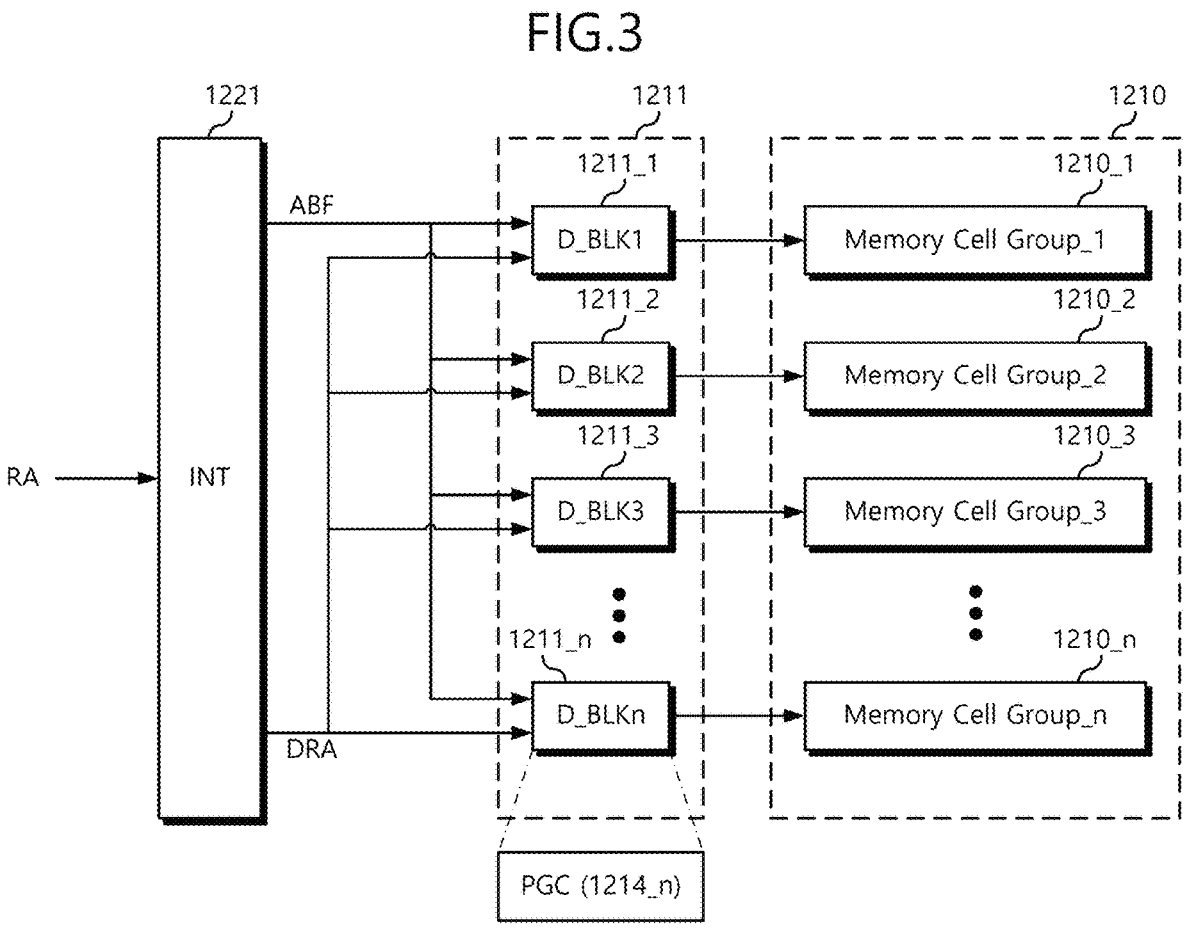
FIG. 3 is a block diagram illustrating an operation of an intermediate block and a row decoder of FIG. 2.

FIG. 3 is a block diagram illustrating an operation of an intermediate block 1221 and a row decoder 1211 of FIG. 2. Referring to FIG. 3, the row decoder 1211 may select a memory cell group based on an active block flag ABF and a decoded row address DRA. The row decoder 1211 may include a plurality of decoding blocks (for example, a first decoding block 1211_1, a second decoding block 1211_2, a third decoding block 1211_3 and so on to an n-th decoding block 1211_n). The memory cell array 1210 may include a plurality of memory cell groups (for example, a first memory cell group 1210_1, a second memory cell group 1210_2, a third memory cell group 1210_3 and so on to an n-th memory cell group 1210_n).

According to some embodiments, the intermediate block 1221 may decode the row address RA, and may output an active block flag ABF and a decoded row address DRA. For example, the intermediate block 1221 may decode the row address RA to generate a decoded row address DRA. In addition, the intermediate block 1221 may extract the active block flag ABF from the decoded row address DRA.

According to some embodiments, each of the plurality of decoding blocks (for example, the first decoding block 1211_1, the second decoding block 1211_2, the third decoding block 1211_3 and so on to the n-th decoding block 1211_n) may include a power gating circuit 1214 (a n-th power gating circuit 1214_n is shown in FIG. 3). For example, when the power gating circuit 1214 of each of the plurality of decoding blocks is in a first state (an enable state), a current supplied to each of the plurality of decoding blocks may be blocked and each of the plurality of decoding blocks may be deactivated. When the power gating circuit of each of the plurality of decoding blocks is in a second state (a disable state), a current may be supplied to each of the plurality of decoding blocks, and each of the plurality of decoding blocks may be activated.

According to some embodiments, the row decoder 1211 may select one wordline, corresponding to a row address RA, among wordlines connected to the memory cell array 1210 based on the active block flag ABF and the decoded row address DRA. For example, in a standby state, the power gating circuit of each of the plurality of decoding blocks may be set to the enable state. When receiving the active block flag ABF (or when an active request is received from the memory controller 1100 in FIG. 1), the row decoder 1211 may change one power gating circuit, corresponding to the active block flag ABF, among the plurality of decoding blocks into the disable state. Power gating circuits of the remaining decoding blocks which do not correspond to the active block flag ABF may remain in the enable state, thereby blocking current. A group of memory cells corresponding to the activated decoding block may be selected. The row decoder 1211 may select a wordline, corresponding to the decoded row address DRA, among wordlines connected to the selected memory cell group based on the decoded row address DRA.

As described above, during receiving an active request, the intermediate block 1221 may convert the row address RA into the active block flag ABF and the decoded row address DRA. When receiving the active request, the row decoder 1211 may activate only one decoding block corresponding to the active block flag ABF and deactivate (or keep deactivated) the remaining decoding blocks. Therefore, when receiving the active request, as compared to a method of activating all decoding blocks and then deactivating the remaining decoding blocks which do not correspond to the row address RA, the row decoder 1211 of the present disclosure may reduce power consumption by activating only the decoding blocks corresponding to the active block flag ABF.

Figure 4:
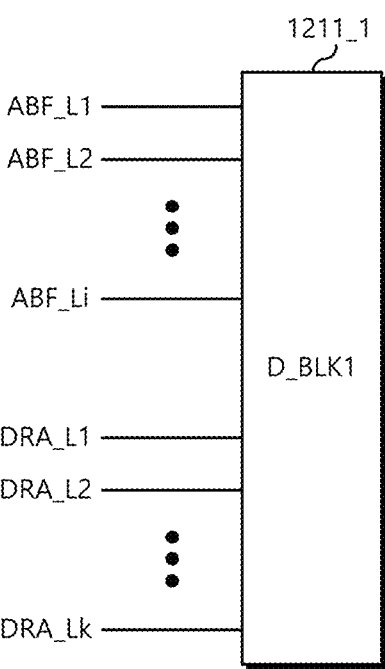
FIG. 4 is a diagram illustrating decoding address lines connected to a single decoding block of FIG. 3.

FIG. 4 is a diagram illustrating decoding address lines connected to a single decoding block of FIG. 3. FIG. 5 is a table illustrating logical values of decoding address lines of FIG. 4. FIG. 6 is a table illustrating states of power gating circuits connected to decoding blocks of FIG. 3 according to a state of a memory device. Referring to FIGS. 4 to 6, states of power gating circuits connected to decoding blocks may be determined based on an active block flag ABF.

According to some embodiments, each of a plurality of decoding blocks may be connected to decoding address lines. For example, a first decoding block 1211_1 may be connected to decoding address lines. The decoding address lines may include a plurality of active block lines (for example, a first active block line ABF_L1, a second active block line ABF_L2 to an i-th active block line ABF_Li) and a plurality of decoded row address lines (for example, a first decoded row address line DRA_L1, a second decoded row address line DRA_L2 and so on to a k-th decoded row address line DRA_Lk). The first decoding block 1211_1 may receive the active block flag ABF through the plurality of active block lines. The first decoding block 1211_1 may receive a decoded row address DRA through the plurality of decoded row address lines. In FIG. 4, the first decoding block 1211_1 is illustrated as an example, but each of the remaining decoding blocks may also be connected to a plurality of active block lines and a plurality of decoded row address lines.

According to some embodiments, in FIG. 5, the plurality of active block lines may have a high level H (e.g., logic 1) or a low level L (e.g., logic 0) based on the active block flag ABF. The plurality of decoded row address lines may have a high level H (e.g., logic 1) or a low level L (e.g., logic 0) based on the decoded row address DRA. A decoding block in which a power gating circuit is to be changed to a disable state may be determined according to the logic values of the plurality of active block lines. A single wordline connected to a selected decoding block may be selected according to the logical values of the plurality of decoded row address lines.

According to some embodiments, in FIG. 6, the power gating circuit of the decoding block corresponding to the active block flag ABF may be switched to a disable state. For example, in a standby state (Standby), a power gating circuit of each of all decoding blocks (D_BLK1, D_BLK2, D_BLK3 to D_BLKn) may be set to an enable state. In an active request reception state (Receiving ACT) subsequent to the standby state, in which an active request ACT is received from the memory controller 1100 of FIG. 1, a power gating circuit of a decoding block (for example, the first decoding block D_BLK1) selected according to the active block flag ABF may be switched to a disable state. Accordingly, a memory cell group (for example, the first memory cell group 1210_1) corresponding to the selected decoding block may be selected. Power gating circuits of the remaining decoding blocks (for example, the second decoding block D_BLK2 to the n-th decoding block D_BLKn) may maintain the enable state. In an active state (Active) subsequent to the active request reception state, the power gating circuit of the selected decoding block (for example, the first decoding block D_BLK1) may maintain the disable state, and a wordline, corresponding to the decoded row address DRA, among wordlines connected to the selected decoding block may be selected.

As described above, in the active request reception state (Receiving ACT), only the power gating circuit of the decoding block selected according to the active block flag ABF may be switched from the enable state to the disable state. Therefore, as compared to a switching method in which the power gating circuits of the remaining decoding blocks except for the decoding block selected are changed to the enable state again in the active state (Active) after the power gating circuits of all decoding blocks are switched to the disable state in the active request reception state (Receiving ACT), the row decoder 1211 of the present disclosure may reduce power consumption by reducing the number of toggles of the power gating circuits of the remaining decoding blocks in the active request reception state (Receiving ACT).

Figure 7:
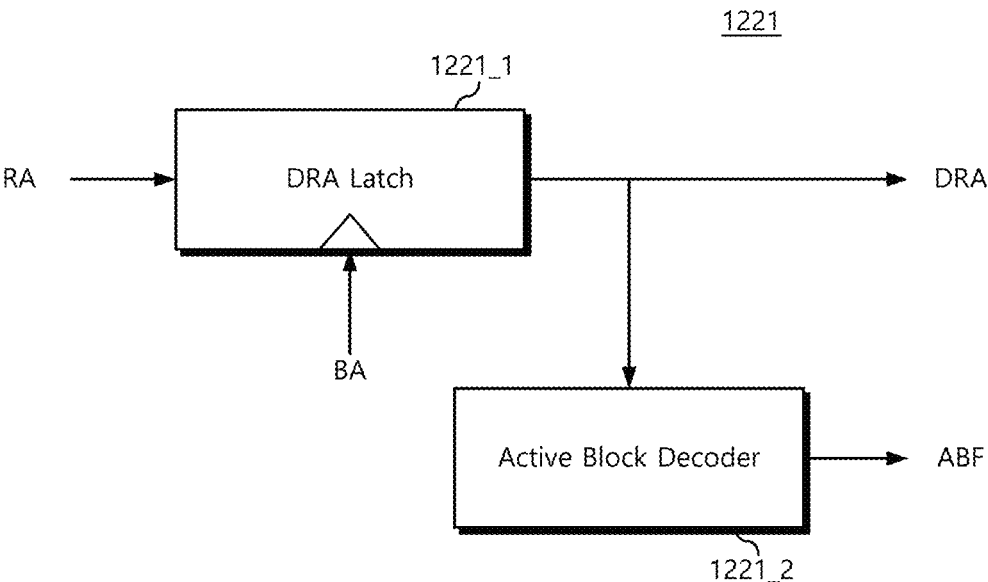
FIG. 7 is a block diagram illustrating an intermediate block of FIG. 3.
Figure 8:
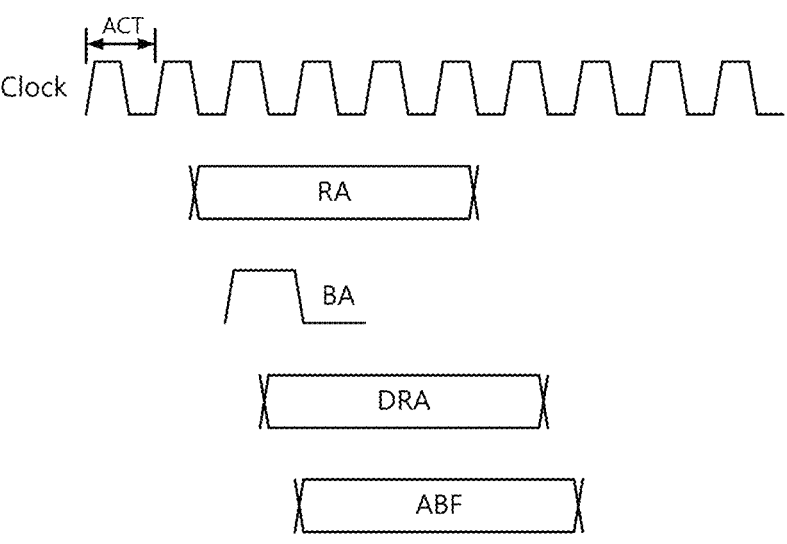
FIG. 8 is a timing diagram illustrating a process of generating an active block flag and a decoded row address of FIG. 7.

FIG. 7 is a block diagram illustrating an intermediate block of FIG. 3. FIG. 8 is a timing diagram illustrating a process of generating an active block flag and a decoded row address of FIG. 7. Referring to FIG. 7, the intermediate block 1221 may include a decoded row address latch 1221_1 and an active block decoder 1221_2. Referring to FIG. 8, the memory device 1200 may receive an active request ACT, a row address RA, and a bank address BA through a command pad.

According to some embodiments, the decoded row address latch 1221_1 may receive the row address RA and output a decoded row address DRA. For example, when receiving the active request ACT in the control logic 1250 of FIG. 2, the decoded row address latch 1221_1 may receive the row address RA. The decoded row address latch 1221_1 may decode the row address RA based on the bank address BA.

According to some embodiments, the active block decoder 1221_2 may receive the decoded row address DRA and output an active block flag ABF. For example, the active block decoder 1221_2 may generate the active block flag ABF by extracting part of the decoded row address DRA.

Figure 9:
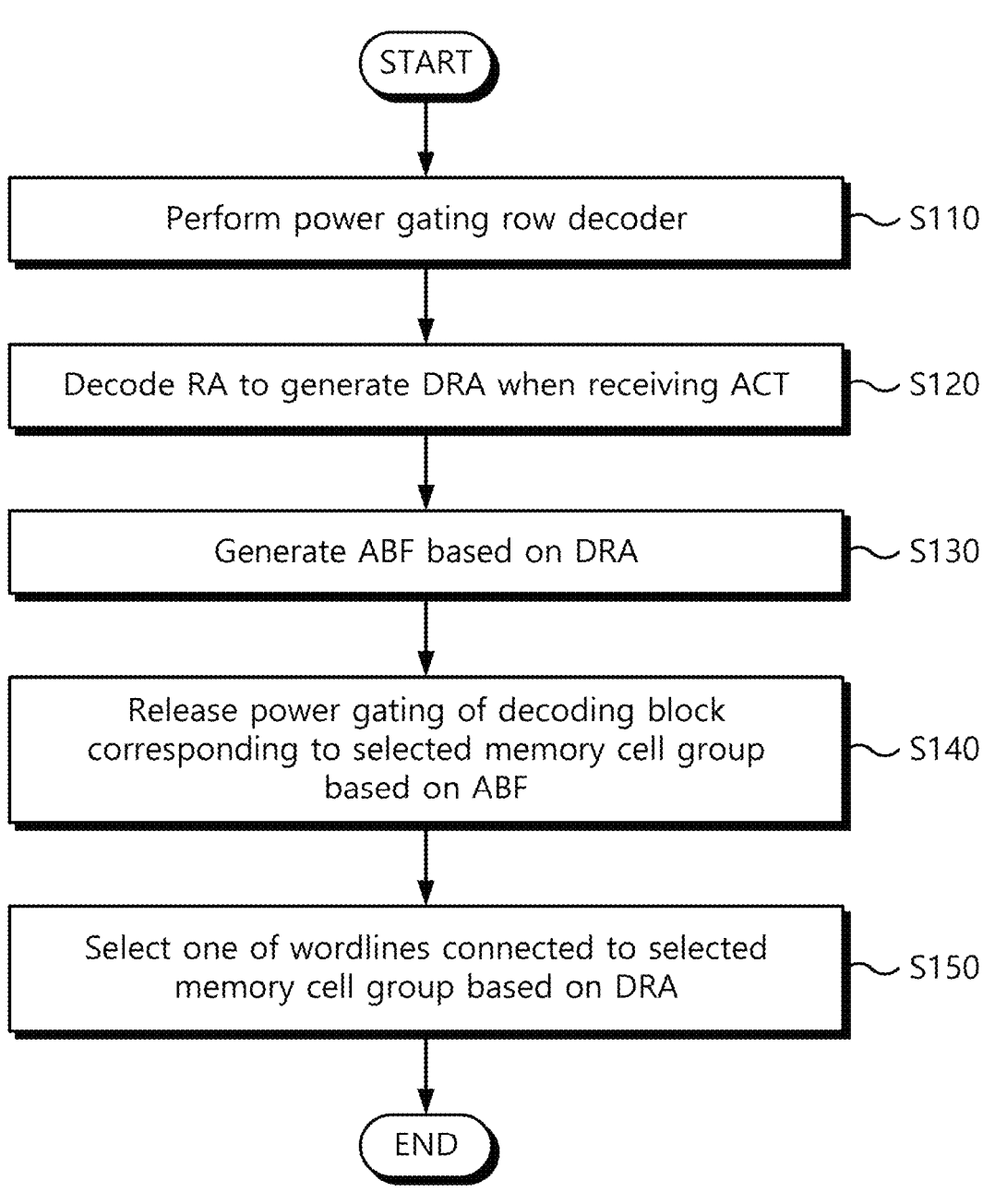
FIG. 9 is a flowchart illustrating an address decoding method of a memory device of FIG. 2.

FIG. 9 is a flowchart illustrating an address decoding method of a memory device of FIG. 2. Referring to FIGS. 2 to 9, during receiving an active request ACT, the memory device 1200 may selectively release gating power for a decoding block corresponding to an active request ACT of the row decoder 1211.

According to some embodiments, in operation S110, the memory device 1200 may gate power of the row decoder 1211. For example, in a standby state (for example, before receiving an active request ACT), the row decoder 1211 may gate power of a plurality of decoding blocks 1211_1 to 1211_n. As an example, each of the plurality of decoding blocks 1211_1 to 1211_n may include a power gating circuit controlling current supply. The power gating circuit may block current supply in an enable state. The power gating circuit may supply current in a disable state. That is, in the standby state, all power gating circuits of the plurality of decoding blocks 1211_1 to 1211_n may be set to the enable state, thus blocking current supply.

According to some embodiments, in operation S120, when receiving an active request ACT, the memory device 1200 may decode a row address RA and may generate a decoded row address DRA. For example, the intermediate block 1221 may decode the row address RA and may output the decoded row address DRA. A decoded row address latch 1221_1 of the intermediate block 1221 may output the decoded row address DRA based on a bank address BA.

According to some embodiments, in operation S130, the memory device 1200 may generate an active block flag ABF based on the decoded row address DRA. For example, an active block decoder 1221_2 of the intermediate block 1221 may extract part of the decoded row address DRA and may output the active block flag ABF. As an example, the active block flag ABF may be composed of upper bits of the decoded row address DRA.

According to some embodiments, in operation S140, the memory device 1200 may release gating power of the decoding block, corresponding to the selected memory cell group, among the plurality of decoding blocks based on the active block flag ABF. For example, in an active request reception state, the row decoder 1211 may switch the power gating circuit of the decoding block corresponding to the active block flag ABF to the disable state. At this time, the power gating circuits of the remaining decoding blocks may be maintained in the enable state.

According to some embodiments, in operation S150, the memory device 1200 may select one of the wordlines connected to the selected memory cell array based on the decoded row address DRA. For example, the row decoder 1211 may select a wordline, corresponding to the decoded row address DRA, among wordlines connected to a decoding block in which gating power is released (or connected to a selected memory cell array).

As described above, in the active request reception state, only the power gating circuit of the decoding block that is selected according to the active block flag ABF may be switched from the enable state to the disable state. Therefore, when compared to a switching method in which the power gating circuits of the remaining decoding blocks except for the decoding block selected are changed to the enable state again in the active state after the power gating circuits of all decoding blocks are switched to the disable state in the active request reception state, the row decoder 1211 of the present disclosure may reduce power consumption by reducing the number of toggles of the power gating circuits of the remaining decoding blocks in the active request reception state.

According to the present disclosure, when receiving an active request, power consumption may be reduced by gating power of decoding blocks unrelated to the active request among all decoding blocks of the row decoder.

While the present disclosure has been described with reference to some examples of embodiments thereof, it will be apparent to those of ordinary skill in the art that various changes and modifications may be made thereto without departing from the spirit and scope of the present disclosure as set forth in the following claims.

What is claimed is:

1. A memory device comprising:
a memory cell array including a plurality of memory cell groups;
an intermediate block configured to decode a row address, and configured to output an active block flag and a decoded row address; and
a row decoder configured to select a wordline of a plurality of wordlines connected to the memory cell array based on the active block flag and the decoded row address,
wherein the row decoder is configured to convert a portion of the row decoder from an inactive state to an active state to activate a selected memory cell group from among the plurality of memory cell groups based on a received active request, the selected memory cell group corresponding to the active block flag, wherein the row decoder is configured to select the wordline of the plurality of wordlines connected to the selected memory cell group based on the decoded row address, and wherein the intermediate block is configured to extract the active block flag from the decoded row address.

2. The memory device of claim 1, wherein the row decoder includes a plurality of decoding blocks,
wherein a first decoding block that corresponds to the selected memory cell group among the plurality of decoding blocks is configured to be switched from an inactive state to an active state based on the active block flag and reception of the active request, and
wherein the decoding blocks of the plurality of decoding blocks other than the first decoding block are configured to be maintained in the inactive state.

3. The memory device of claim 2, wherein each of the plurality of decoding blocks is connected to the intermediate block through a plurality of active block lines and a plurality of decoded row address lines.

4. The memory device of claim 3, wherein the row decoder is configured to transmit the active block flag to a decoding block corresponding to the selected memory cell group through the plurality of active block lines.

5. The memory device of claim 3, wherein the row decoder is configured to transmit the decoded row address to a decoding block that corresponds to the selected memory cell group through the plurality of decoded row address lines.

6. The memory device of claim 1, wherein the row decoder includes a plurality of decoding blocks,
wherein each of the plurality of decoding blocks includes a power gating circuit configured to control a respective current supply, and

wherein power gating circuits of the plurality of decoding blocks are configured to be set to an enable state to block current supply in a standby state before reception of the active request.

7. The memory device of claim 6, wherein a power gating circuit of a decoding block corresponding to the selected memory cell group is configured to be switched from an enable state in which current is blocked to a disable state in which current is supplied during an active request reception state at which the active request is received.

8. The memory device of claim 7, wherein power gating circuits of the decoding blocks of the plurality of decoding blocks other than the decoding block corresponding to the selected memory cell group are configured to be maintained in the enable state.

9. The memory device of claim 7, wherein a power gating circuit of a decoding block that corresponds to the selected memory cell group is configured to be maintained in the disable state during an active state at which the selected wordline is determined among wordlines connected to the selected memory cell group.

10. The memory device of claim 7, wherein a decoding block that corresponds to the selected memory cell group is configured to select the wordline of the plurality of wordlines connected to the selected memory cell group based on the decoded row address during an active state at which the selected wordline is determined among the wordlines connected to the selected memory cell group.

11. A method of decoding an address of a memory device, the method comprising:
gating power of a plurality of decoding blocks included in a row decoder of the memory device;
decoding a row address to generate a decoded row address during receiving an active request;
generating an active block flag based on the decoded row address;
releasing gating power of a first decoding block of the plurality of decoding blocks based on the active block flag, the first decoding block corresponding to a selected memory cell group; and
selecting a wordline of a plurality of wordlines connected to the selected memory cell group based on the decoded row address, wherein the generating an active block flag based on the decoded row address comprises extracting the active block flag from the decoded row address using an intermediate block.

12. The method of claim 11, wherein the generating of the decoded row address comprises decoding the row address based on a bank address.

13. The method of claim 12, wherein the active block flag is composed of upper bits of the decoded row address.

14. The method of claim 11, wherein the generating of the active block flag comprises extracting a part of the decoded row address to generate the active block flag.

15. The method of claim 11, wherein each of the plurality of decoding blocks includes a power gating circuit configured to control a respective current supply, and
wherein the releasing gating power of the first decoding block comprises switching the power gating circuit of the first decoding block from an enable state to a disable state.

16. A memory device comprising:
a memory cell array including a plurality of memory cell groups;
an intermediate block configured to decode a row address and output an active block flag and a decoded row address; and a row decoder including a plurality of decoding blocks, each connected to a respective memory cell group from the plurality of memory cell groups, wherein the row decoder is configured to:

release gating power of a selected decoding block of the plurality of decoding blocks based on the active block flag and reception of an active request;

maintain gating power of the decoding blocks of the plurality of decoding blocks other than the selected decoding block; and select a wordline corresponding to the decoded row address among wordlines connected to the selected decoding block, wherein the intermediate block is configured to extract the active block flag from the decoded row address.

17. The memory device of claim 16, wherein each of the plurality of decoding blocks includes a power gating circuit configured to control a respective current supply, and wherein each power gating circuit is configured to be set to an enable state to block current supply in a standby state before the reception of the active request.

18. The memory device of claim 17, wherein a power gating circuit of the selected decoding block is configured to be switched from an enable state in which current is blocked to a disable state in which current is supplied during an active request reception state at which the active request is received, and wherein power gating circuits of the decoding blocks other than the selected decoding block are configured to be maintained in the enable state during the active request reception state.

19. The memory device of claim 16, wherein the intermediate block comprises:

a decoded row address latch that is configured to decode the row address and output the decoded row address; and an active block decoder that is configured to decode the decoded row address and output the active block flag.

20. The memory device of claim 19, wherein the active block decoder is configured to extract upper bits of the decoded row address to generate the active block flag.

* * * * *